United States Patent
Alptekin et al.

(10) Patent No.: US 9,496,362 B1
(45) Date of Patent: Nov. 15, 2016

(54) CONTACT FIRST REPLACEMENT METAL GATE

(71) Applicant: INTERNATIONAL BUSINESS MACHINES CORPORATION, Armonk, NY (US)

(72) Inventors: Emre Alptekin, Fishkill, NY (US); Ravikumar Ramachandran, Pleasantville, NY (US); Viraj Y. Sardesai, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/987,075

(22) Filed: Jan. 4, 2016

(51) Int. Cl.
*H01L 21/8234* (2006.01)
*H01L 29/49* (2006.01)
*H01L 29/78* (2006.01)
*H01L 29/45* (2006.01)
*H01L 29/66* (2006.01)
*H01L 21/768* (2006.01)
*H01L 21/283* (2006.01)

(52) U.S. Cl.
CPC ......... *H01L 29/4958* (2013.01); *H01L 21/283* (2013.01); *H01L 21/7684* (2013.01); *H01L 21/76846* (2013.01); *H01L 21/76865* (2013.01); *H01L 21/76889* (2013.01); *H01L 29/456* (2013.01); *H01L 29/66545* (2013.01); *H01L 29/78* (2013.01)

(58) Field of Classification Search
CPC ............ H01L 29/0847; H01L 29/267; H01L 29/4966; H01L 29/517; H01L 29/6653; H01L 29/66545; H01L 29/66553; H01L 29/6659; H01L 29/66628; H01L 29/7834
USPC .................................................. 438/275–308
See application file for complete search history.

(56) References Cited

U.S. PATENT DOCUMENTS

| | | |
|---|---|---|
| 8,679,968 B2 | 3/2014 | Xie et al. |
| 2012/0112290 A1 | 5/2012 | Utomo et al. |
| 2012/0313148 A1 | 12/2012 | Schultz |
| 2014/0117421 A1 | 5/2014 | Seo et al. |
| 2015/0137194 A1 | 5/2015 | Wei |
| 2015/0236106 A1 | 8/2015 | Zaleski et al. |
| 2016/0013313 A1* | 1/2016 | Cheng ............... H01L 29/267 257/408 |

* cited by examiner

*Primary Examiner* — H Tsai
(74) *Attorney, Agent, or Firm* — Cantor Colburn LLP; Jennifer Anda

(57) ABSTRACT

A technique relates to forming a semiconductor device. Sacrificial gates are formed on a channel region of a substrate. Epitaxial layers are grown on source-drain areas between the sacrificial gates. A contact liner and contact material are deposited. The liner and the contact material are removed from above the sacrificial gates. Contact areas are blocked with one or more masking materials and etched. The masking material is removed. The contact material is partially recessed and a nitride liner deposited. An oxide layer is deposited and the sacrificial gate is removed. A metal gate is formed on the channel region and recessed. Insulator material and metal gate material are recessed and a cap is formed over the gate.

17 Claims, 9 Drawing Sheets

CONTACT FIRST REPLACEMENT METAL GATE

BACKGROUND

The present invention relates to semiconductor devices, and more specifically, to the formation of metallic gate electrodes using a replacement gate process technique.

Advances in specific semiconductor disciplines, such as photolithography, and dry etching, have been major contributors to micro-miniaturization, however structural innovations, such as the use of self-aligned contact, (SAC), openings, and SAC structures, have also played a vital role in achieving the performance and cost objectives of the semiconductor industry.

In advanced sub-32 nanometer (nm) technologies, a replacement metal gate (RMG) can be employed with a pre/post metal anneal (PMA). However, an issue is the tight gate-to-gate spacing and a design requirement to place a contact there between. In many cases, the gate-to-gate pitch is so narrow that placing a contact between two gates using direct patterning is challenging because, for example, of the small contact size. In some cases, design requirements can result in applying up to six to eight masks during manufacture to overcome such constraints, however, the overlay between gate and contact remains problematic.

Methods for 10 nm MOL (middle of the line) technologies use SAC processes with three masks, CA/CC/CE, in a triple exposure process, litho-etch-litho-etch-litho-etch (LELELE). However, such processes can be difficult for manufacture. For example, because each litho and etch differs and is dependent on pattern density leading, etch variability is present. Processes are susceptible to SAC underetching and overetching, which could result in either high contact resistance and a resultant increase in leakage (in the case of overetching or gouging of epitaxial layers), or electrical opens (in the case of underetching). Furthermore, using multiple patterning technologies, such as LELELE processes, can prevent the use of fully landed self aligned contacts and increase the potential for misalignment. In addition, in such processes, a SAC cap formed by the replacement metal gate recess/insulator fill and polish process can have high variation and tolerances. Moreover, the need for a SAC cap in such processes increase the required thickness of gate poly which results in difficulties in polysilicon conductor (PC) etch. In addition, such devices can be susceptible to hollow metal void defects. Thus, improved processes for RMG technologies are needed.

SUMMARY

According to an embodiment of the present disclosure, a method of forming a semiconductor device includes forming a plurality of sacrificial gates on a channel region of a substrate. The method also includes growing epitaxial layers on one or more source-drain areas between the sacrificial gates by an epitaxial growth process. The method also includes depositing a contact liner. The method also includes depositing a contact material. The method also includes partially removing the liner and the contact material, such that the liner and the contact material are removed from above the sacrificial gates. The method also includes blocking one or more contact areas with one or more masking materials to create exposed contact material and blocked contact material. The method also includes etching a portion of the exposed contact material. The method also includes removing the masking material. The method also includes partially recessing the contact material such that the contact areas have contact material that is at a height that is lower than a target metal gate height. The method also includes depositing a nitride liner. The method also includes depositing an oxide layer on the nitride liner. The method also includes removing the sacrificial gate, thereby leaving an opening in area channel region. The method also includes forming a metal gate on the channel region. The method also includes recessing the metal gate to a height that is above a height of the oxide layer in between the gates. The method also includes partially recessing the insulator material and the metal gate material to the target metal gate height and forming a cap over the metal gate.

According to another embodiment of the present disclosure, a method of forming a semiconductor device includes forming a plurality of sacrificial gates on a channel region on a substrate with spacers on sides of the sacrificial gates. The method also includes growing epitaxial layers on one or more source-drain areas between the sacrificial gates by an epitaxial growth process. The method also includes depositing a liner. The method also includes depositing a contact material. The method also includes uniformly recessing the contact material to a target contact height. The method also includes depositing a nitride liner. The method also includes depositing an oxide layer on the nitride liner. The method also includes planarizing to expose the sacrificial gate. The method also includes removing the sacrificial gate, thereby exposing the channel region. The method also includes lining the opening with an insulator material. The method also includes filling the opening with a metal gate material. The method also includes partially recessing the insulator material and the metal gate material to the target metal gate height and forming a cap over the metal gate material. The method also includes blocking one or more contact areas with one or more masking materials to create exposed contact material and blocked contact material. The method also includes etching a portion of the exposed contact material.

According to yet another embodiment of the disclosure, a semiconductor device includes a gate stack arranged on a substrate. The semiconductor device also includes a spacer arranged adjacent to the gate stack. The semiconductor device also includes an epitaxially grown source/drain region arranged on the substrate adjacent to the gate stack. The semiconductor device also includes a first conductive contact arranged on the gate stack, the first conductive contact having a bottom surface below the top surface of the spacer. The semiconductor device also includes a second conductive contact arranged on the source/drain region, the second conductive contact having a first region contacting the source/drain region, and a second region contacting the first region, the first region of the second conductive contact having upper surface arranged substantially coplanar with a top surface of the spacer.

BRIEF DESCRIPTION OF THE DRAWINGS

FIGS. 1A-1K illustrate an exemplary fabrication process of forming a transistor in accordance with an embodiment, in which:

FIG. 1A is a cross-sectional view illustrating sacrificial gate and epitaxial layer formation of the transistor device according to an embodiment, FIG. 1B is a cross-sectional view of the transistor device illustrating depositing a liner and contact material followed by polishing of the device and blocking contact areas according to an embodiment, FIG. 1C is a cross-sectional view of the transistor device illustrating partially recessing liner and contact material and removal of the masking material according to an embodiment, FIG. 1D is a cross-sectional view of the transistor device illustrating partially recessing the contact material to a height below the target metal gate height according to an embodiment, FIG. 1E is a cross-sectional view of the transistor device illustrating depositing a nitride liner and an oxide layer according to an embodiment, FIG. 1F is a cross-sectional view of the transistor device illustrating planarizing the transistor to expose the sacrificial gate and removing the sacrificial gate according to an embodiment, FIG. 1G is a cross-sectional view of the transistor device illustrating depositing an insulator and replacement metal gate material in the sacrificial gate opening according to an embodiment, FIG. 1H is a cross-sectional view of the transistor device illustrating partially recessing the insulator and replacement metal gate material according to an embodiment, FIG. 1I is a cross-sectional view of the transistor device illustrating depositing nitride liner to form a shallow cap over the gate according to an embodiment, FIG. 1J is a cross-sectional view of the transistor device illustrating recessing the transistor to expose the contact material according to an embodiment, and FIG. 1K is a cross-sectional view of the transistor device illustrating depositing an interlayer dielectric and patterning contacts in the interlayer dielectric according to an embodiment;

FIGS. 2A-2I illustrate an exemplary fabrication process of forming a transistor in accordance with an embodiment, in which:

FIG. 2A is a cross-sectional view of the transistor device illustrating uniformly recessing contact material on the transistor to a height below the target metal gate height according to an embodiment, FIG. 2B is a cross-sectional view of the transistor device illustrating depositing a nitride liner and oxide layer according to an embodiment, FIG. 2C is a cross-sectional view of the transistor device illustrating removing the sacrificial gate to create an opening according to an embodiment, FIG. 2D is a cross-sectional view of the transistor device illustrating lining the gate opening with insulator material and replacement metal gate material according to an embodiment, FIG. 2E is a cross-sectional view of the transistor device illustrating partially recessing the insulator material and replacement metal gate material according to an embodiment, FIG. 2F is a cross-sectional view of the transistor device illustrating forming a nitride shallow cap over the gate according to an embodiment, FIG. 2G is a cross-sectional view of the transistor device illustrating blocking contact areas according to an embodiment, FIG. 2H is a cross-sectional view of the transistor device illustrating etching the transistor, removing the masking material, and depositing an interlayer dielectric according to an embodiment, and FIG. 2I is a cross-sectional view of the transistor device illustrating patterning contacts in the interlayer dielectric according to an embodiment.

DETAILED DESCRIPTION

In accordance with the disclosure, improved methods for RMG technologies are provided using contact first with replacement metal gates. Such methods can ensure good reaction contact areas and resistance and reduce processing difficulties associated with conventional methods, for example due to multiple masking techniques.

Figure 1A:
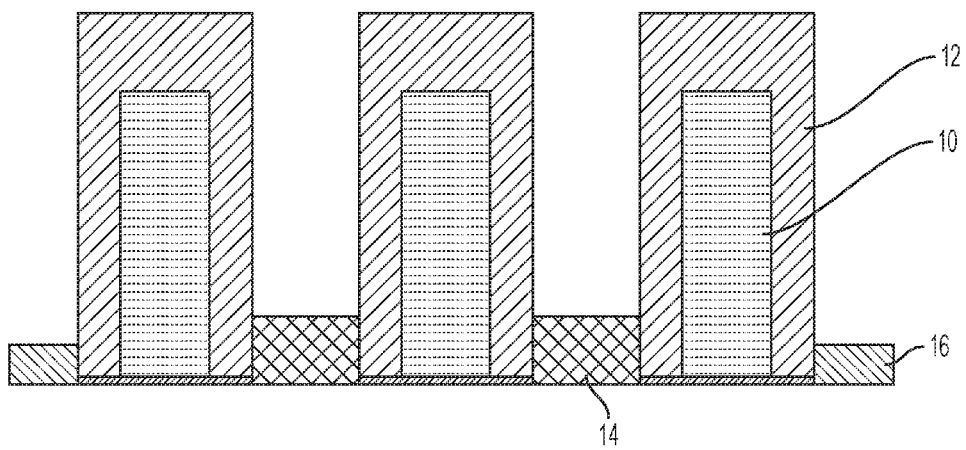

With reference now to the figures, FIGS. 1A-1K illustrate a first exemplary method of forming a transistor in accordance with one embodiment. As is illustrated in FIG. 1A, a plurality of sacrificial (dummy) gates 10 are formed on a substrate. The sacrificial gate 10 may be polysilicon oxide, and/or a nonmetal. The sacrificial gates 10 are lined and capped with a nitride or oxide layer 12. The sacrificial gates can form, for example, a portion of an nFET or a pFET transistor and the transistor can be separated from another transistor with an isolation region 16. A substrate can include any silicon containing substrate including, but not limited to Si, bulk Si, single crystal Si, crystalline Si, SiGe, amorphous Si, silicon-on-insulator substrates (SOI), SiGe-on-insulator (SGOI), strained-silicon-on-insulator, annealed poly Si, and poly Si line structures. The spacers, formed of nitride or oxide layer 12, can be formed by standard processes used in semiconductor technologies. A source and drain can be implanted in the substrate. The spacer can be a nitride. One or more epitaxial layers 14 can be grown by an epitaxial process in between the sacrificial gates 10 in the source-drain areas between the gates according to methods known in the art. The epitaxial layer 14 can be comprised of any epitaxial material useful in semiconductor applications, such as a silicon-carbon-phosphorous (SiCP) material, or silicon-germanium (SiGe) material. The epitaxial layer 14 can be a highly doped layer, for example a layer comprised of a high boron-doped SiGe film. In accordance with an embodiment, the transistor can be cleaned according to conventional methods in preparation for subsequent steps.

As used herein, "depositing" may include any now known or later developed techniques appropriate for the material to be deposited including but not limited to, for example: chemical vapor deposition (CVD), low-pressure CVD (LP-CVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography, nanoimprint lithography, and reactive ion etching.

Figure 1B:
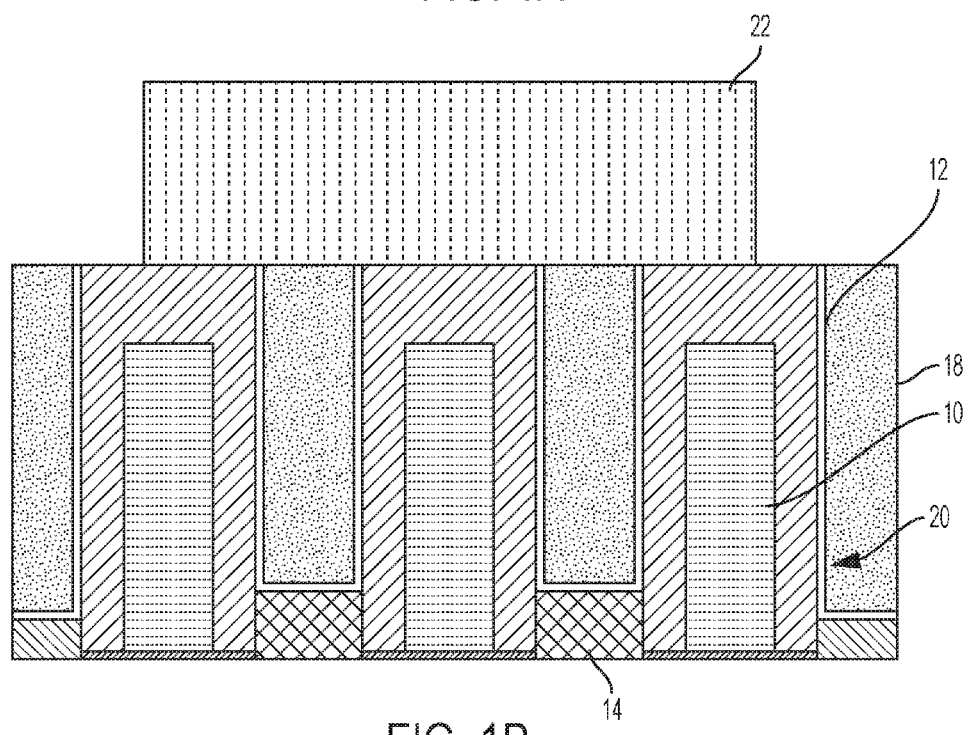

According to an embodiment, with reference to FIG. 1B, a liner 20 and a contact material 18 are deposited on the transistor. The liner 20 can be a work function metal composition. In some embodiments, the liner 20 is titanium based liner, such as titanium, titanium nitride, or titanium carbide, or an alloy such as but not limited to titanium-niobium. In some embodiments, the liner 20 is another work function metal composition, such as tantalum nitride and/or tantalum carbide. The contact material 18 is a low resistance metal, such as tungsten or aluminum. In some embodiments, the contact material 18 is tungsten. In some embodiments, the contact material 18 is tungsten and the liner 20 is titanium or titanium nitride. After depositing contact material 18, as shown in FIG. 1B, the transistor can be recessed such that all contact material 18 and liner 20 are removed above the sacrificial gates 10 to the top of the nitride or oxide layer 12. In some embodiments, the contact material 18 and liner 20 are recessed by planarization, such as chemical mechanical planarization. In other embodiments, the contact material 18 and liner 20 are recessed by Gas Cluster Ion Beams (GCIB), reactive ion etching (RIE) or wet etching. Next, as is illustrated in FIG. 1B, contact areas can be blocked with a masking materials 22. Masking material 22 includes a material that is photosensitive at a wavelength range. The masking material 22 can be, for example, a photoresist, such as a deep ultraviolet (DUV) photoresist, a mid-ultraviolet (MUV) photoresist, or extreme US (EUV) or an electron beam (e-beam) photoresist. In some embodiments, a large feature (such as FX) mask is used. In some embodiments, an active area (RX) mask is used. In some embodiments, multiple masks can be used. For instance, one mask may be used to block large contact areas while another mask can be used for relatively small areas between nested contacts, for example in SRAM applications.

Figure 1C:
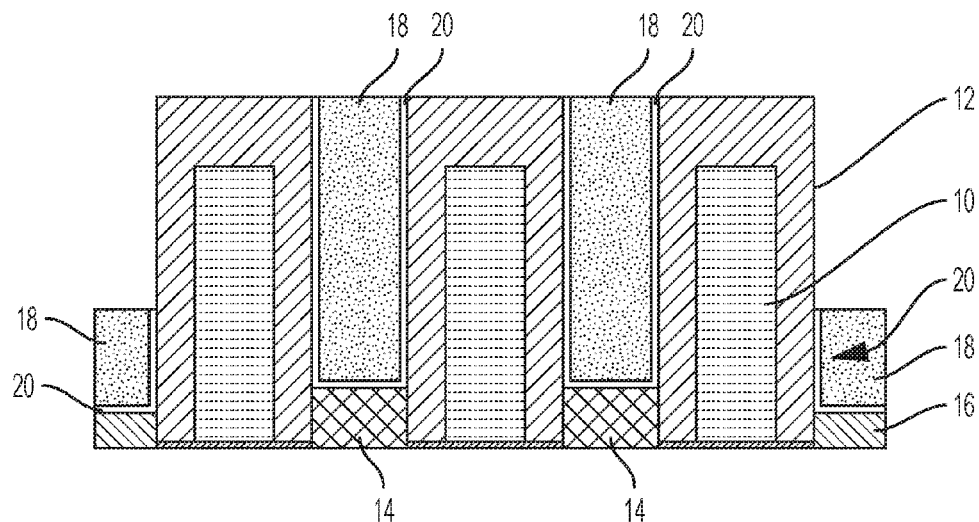

Next, as shown in FIG. 1C, an embodiment includes removing all or a portion of the unmasked contact material 18 and liner 20, for instance by etching, and stripping the masking material 22 from the transistor. In some embodiments, the unmasked contact material 18 and liner 20 are completely removed through etching. In some embodiments, the unmasked contact material 18 and liner 20 are etched, prior to removing the masking material 22, to a level that allows their complete removal in the subsequent step.

Figure 1D:
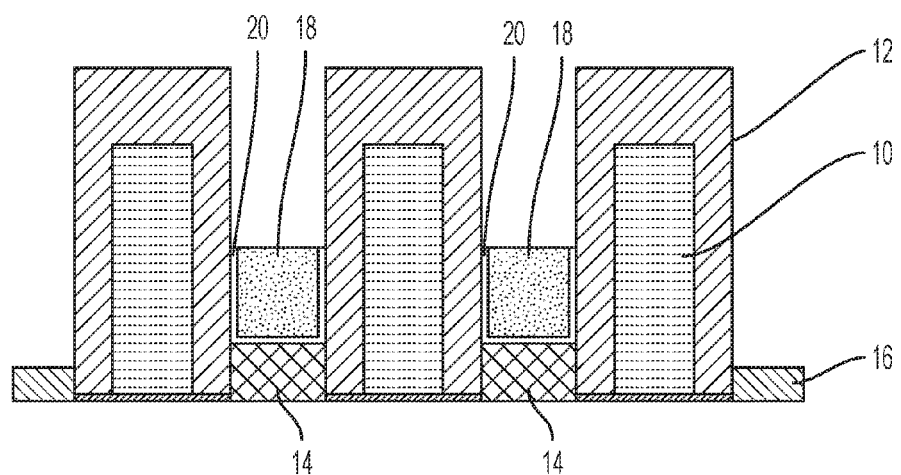

As shown FIG. 1D, an embodiment next includes recessing the contact material 18 and liner 20 to a height that is lower than the target metal gate height, or the desired replacement metal gate height, of the transistor. Contact material 18 and liner 20 are removed from all other areas of the transistor. For example, after recessing in accordance with this step, contact material 18 and liner 20 can be completely removed from channel regions 16 and can be present in between the gates 10.

Figure 1E:
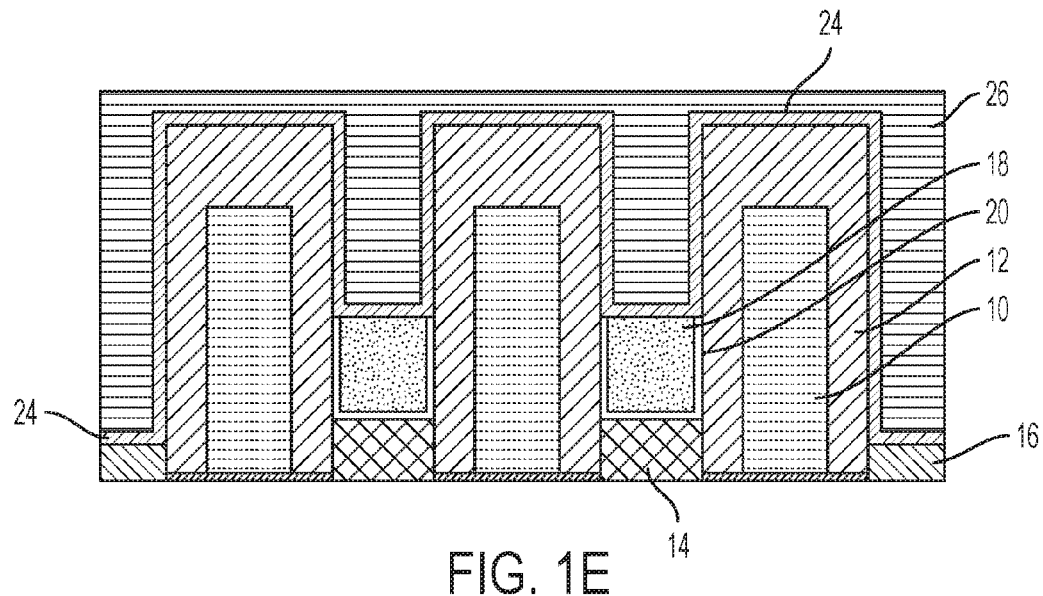

As illustrated in FIG. 1E, a nitride liner or a poly-open-CMP (POC) liner 24 and oxide layer 26 are next deposited in accordance with some embodiments. The oxide layer 26 includes any oxide useful for such semiconductor applications. In some embodiments, the oxide is applied through flowable CVD (FCVD) or a high-density plasma (HDP) oxide or spin on dielectric or fluorinated oxide deposition process.

Figure 1F:
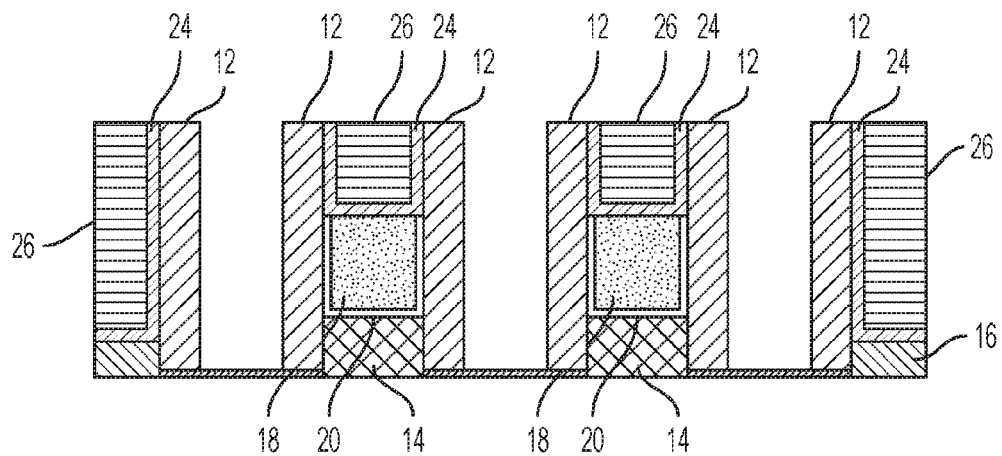

Next, as shown in FIG. 1F, an embodiment includes removing the sacrificial gate. For example, the transistor can first be recessed through the nitride cap 12 on the sacrificial gate 10 to the top of the sacrificial gate 10, exposing the sacrificial gate 10, by reactive ion etching or CMP. Next, the sacrificial gate 10 is removed, leaving an opening in the gate area.

Figure 1G:
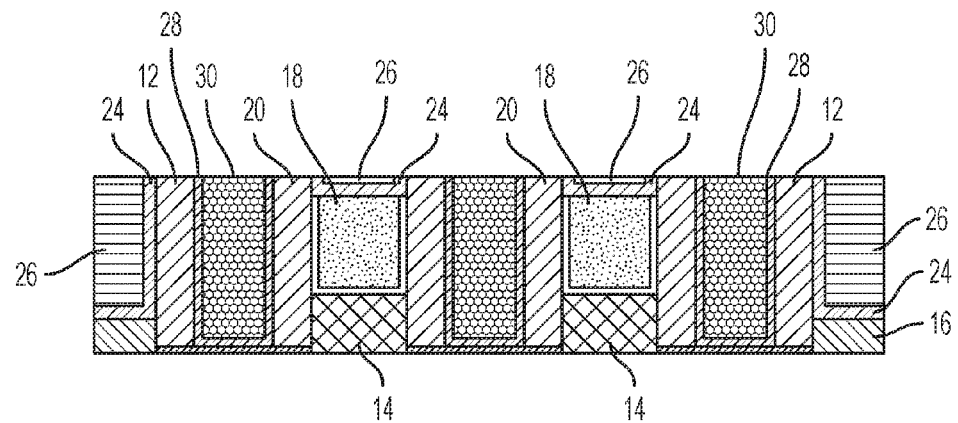

Then, as shown in FIG. 1G, the opening in the gate area can be lined with an insulator material 28, such as a high-k dielectric material, and then filled with a replacement metal gate material 30. The insulator layer 28 can be deposited on the top surface of the transistor device and is and/or includes hafnium oxide, silicate, or other metals with a high-k dielectric constant. The replacement metal gate material 30 can be a low resistance metal. In some embodiments, the replacement metal gate material 30 is tungsten, aluminum, or cobalt. The device is then recessed, such as through CMP, to a height such that insulator material 28 and gate material 30 remain at a height that is above the contact material 18 in the adjacent gate and a relatively small layer of adjacent oxide layer 26 and nitride liner 24 remains in the contact area. For example, the transistor can be recessed approximately 30 nm.

Figure 1H:
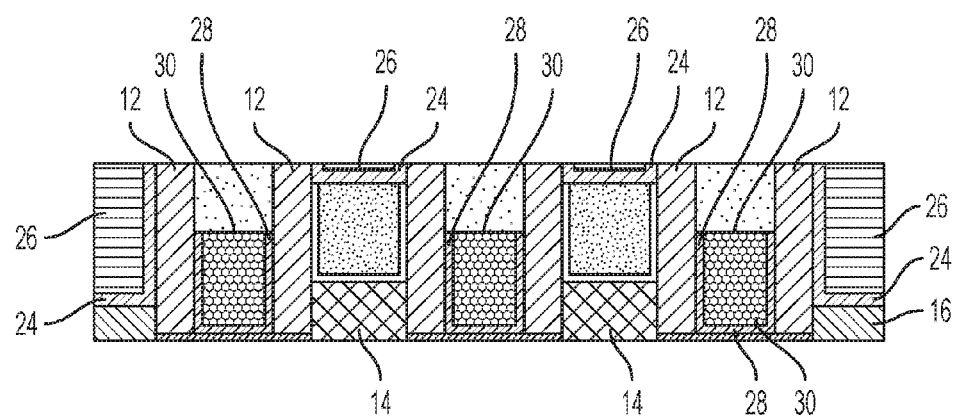

Next, as shown in FIG. 1H, the replacement metal gate material 30 and insulator material 28 are recessed to a height that is lower than the target metal gate height. The height of the recessed metal gate material 30 is below the height of the contact material 18 in the contact areas.

Figure 1I:
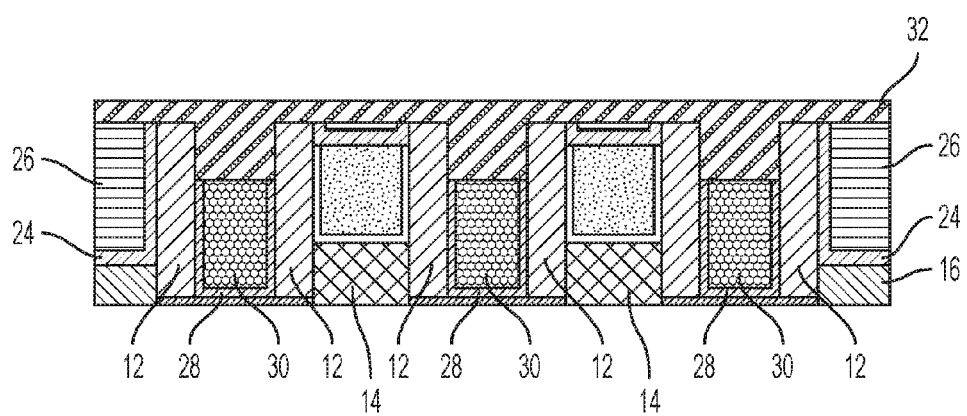

Then, as is illustrated in FIG. 1I, in an embodiment, nitride shallow cap material 32 is deposited on the transistor and fills the remaining opening in the gates.

Figure 1J:
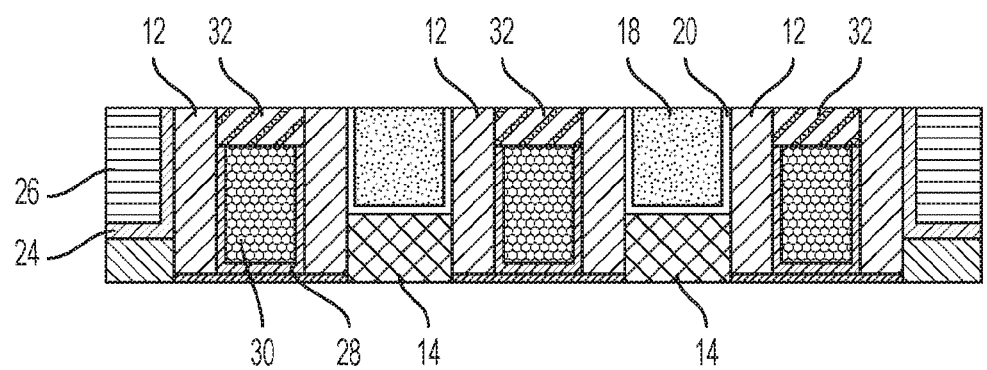

As shown in FIG. 1J, in one embodiment the nitride shallow cap material 32 can be removed from on top of the contact areas and nitride or oxide layer 12. In some embodiments, the excess nitride shallow cap material 32 is removed with CMP. In some embodiments, the excess nitride material is removed with GCIB. As is illustrated in FIG. 1J, contacts in the source-drain areas are exposed.

Figure 1K:
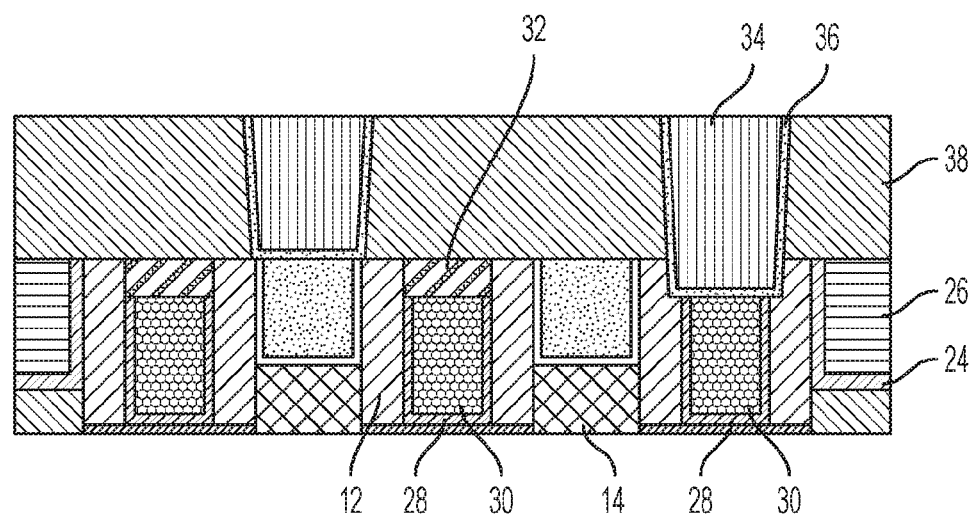

In some embodiments, as shown in FIG. 1K, interlayer dielectric (ILD) is deposited on the transistor. In further embodiments, contact gates 34 can be patterned in the ILD. The contact gates 34 can be separated from the ILD with a liner 36, and can form physical connections with the replacement metal gate material 30 in the gate area or can form physical connections with the contact material 18 in the source drain area.

A second embodiment includes the process of the first exemplary method wherein, after epitaxial growth in the source-drain areas and before depositing a liner 20 on the transistor, a silicide over the epitaxial layer is formed. For example, in some embodiments, to form the silicide, a metal layer, such as a metal alloy layer is deposited on the epitaxial layer. The metal layer, or metal alloy layer can be deposited by any method commonly used in the semiconductor industry. In one embodiment, the metal layer or metal alloy layer comprises a metal selected from the group consisting of Ni, Co, Pt, Pd, Ta, Ti, Nb, V, Hf, Zr, Mo, W, and alloys thereof. To form the silicide layer, the metal layer or metal alloy layer can next be thermally annealed at a temperature of 100° C. to 1,000° C., or 200° C. to 600° C.

Figure 2A:
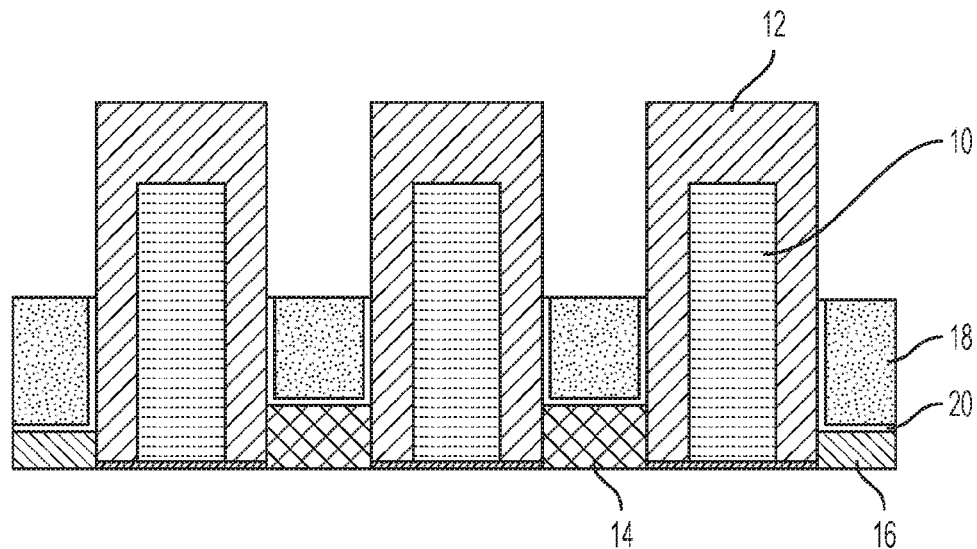

FIGS. 2A-2I illustrate a third exemplary method of forming a transistor in accordance with one embodiment. In the third exemplary method, a plurality of sacrificial gates 10 are formed on a substrate, as illustrated in FIG. 2A. The sacrificial gates 10 are lined and capped with a nitride or oxide layer 12. The sacrificial gates can form, for example, a portion of an nFET or a pFET transistor and the transistor can be separated from another transistor with a channel region 16. One or more epitaxial layers 14 can be grown by an epitaxial process in between the sacrificial gates 10 in the source-drain areas between the gates according to methods known in the art. Then, a liner 20 and a contact material 18 are deposited on the transistor. After depositing contact material 18, the transistor can be recessed such that all contact material 18 and liner 20 are removed above the sacrificial gates 10 to the top of the nitride or oxide layer 12 as is depicted in FIG. 1B. Then, in accordance with the third exemplary method, as shown in FIG. 2A, the contact material 18 and liner 20 are uniformly recessed on the transistor to a target contact height.

Figure 2B:
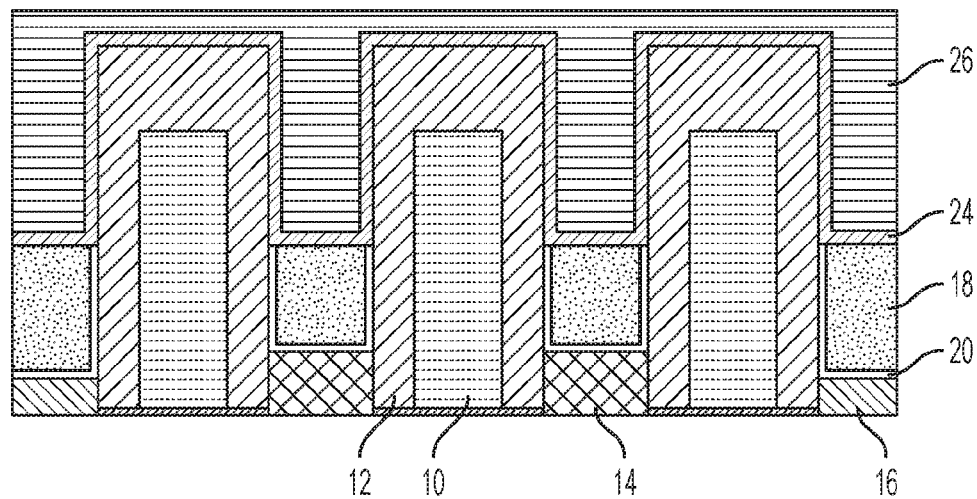
Figure 2C:
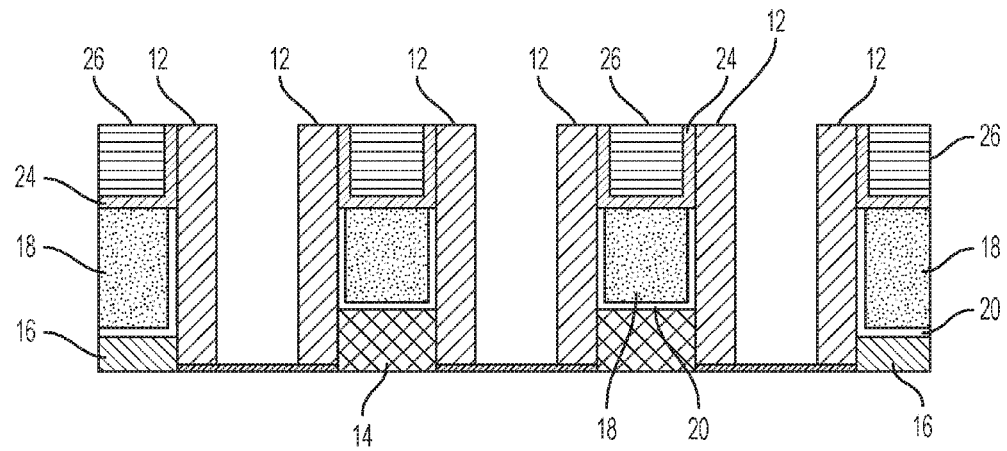

Next, as shown in FIG. 2B, the exemplary method includes depositing a nitride liner 24 and an oxide layer 24 on the transistor. Then, as illustrated in FIG. 2C, the exemplary method includes planarizing the transistor to remove the nitride liner 12 from the top of the sacrificial gate 10 of FIG. 2B, and removing the sacrificial gate thereby leaving an opening in the gate area. The transistor can be polished or etched to the top of the sacrificial gate, for example with RIE, CMP or GCIB.

Figure 2D:
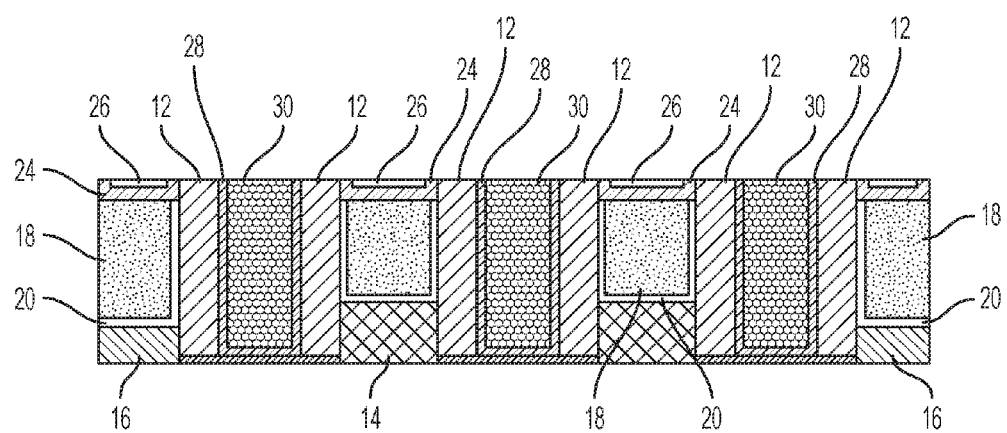

As shown in FIG. 2D, the exemplary method next includes lining the gate opening with an insulator material 20 and then filling the opening with a replacement metal gate material 18. The transistor can then be polished, for example with CMP, to form the RMG.

Figure 2E:
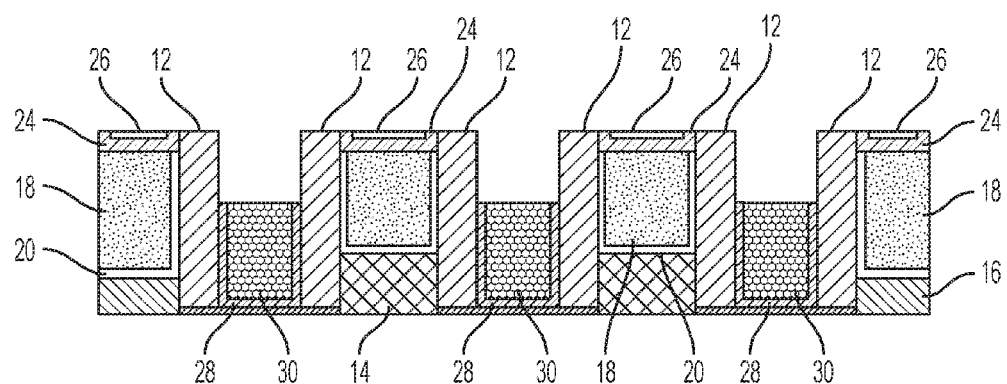

Then, as illustrated in FIG. 2E, the exemplary method includes partially recessing the insulator material 20 and replacement metal gate material 18 to the target RMG gate height. The recessing also provides an opening in the gate above the replacement gate material 18 for a shallow nitride cap.

Figure 2F:
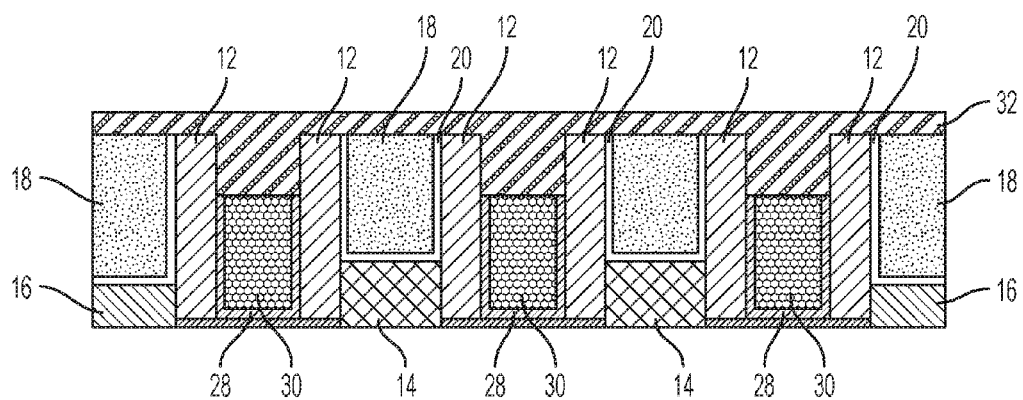

As shown in FIG. 2F, an embodiment includes depositing a shallow nitride cap material 32 or thin insulator layer, for example by ALD.

Figure 2G:
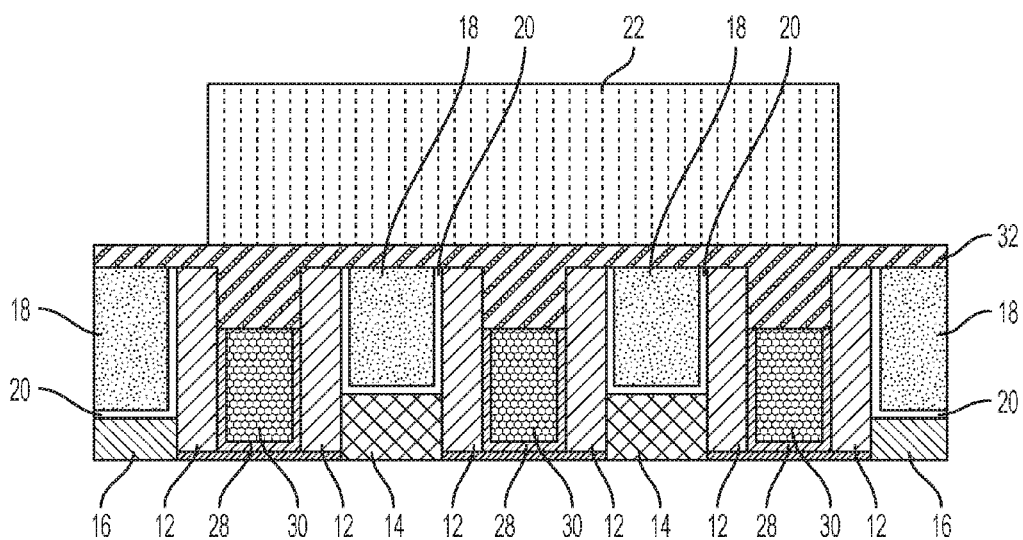

As depicted in FIG. 2G, in accordance with the third exemplary method, one or more masking materials 22, such as a resist layer, are then patterned on the transistor to block to cover replacement metal gate 30 and desired contact areas between the gates. Unwanted contact material 18 and liner 20, such as contact material 18 and liner 20 in channel regions 16, can be removed from the transistor.

Figure 2H:
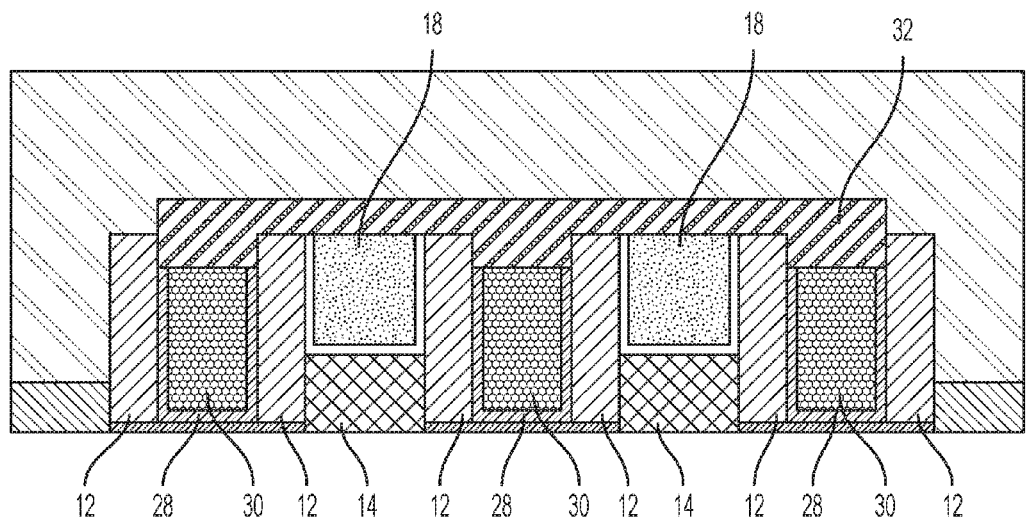

As is illustrated in FIG. 2H, in an embodiment masking materials 22 can be then removed from the transistor and ILD 38 is deposited.

Figure 2I:
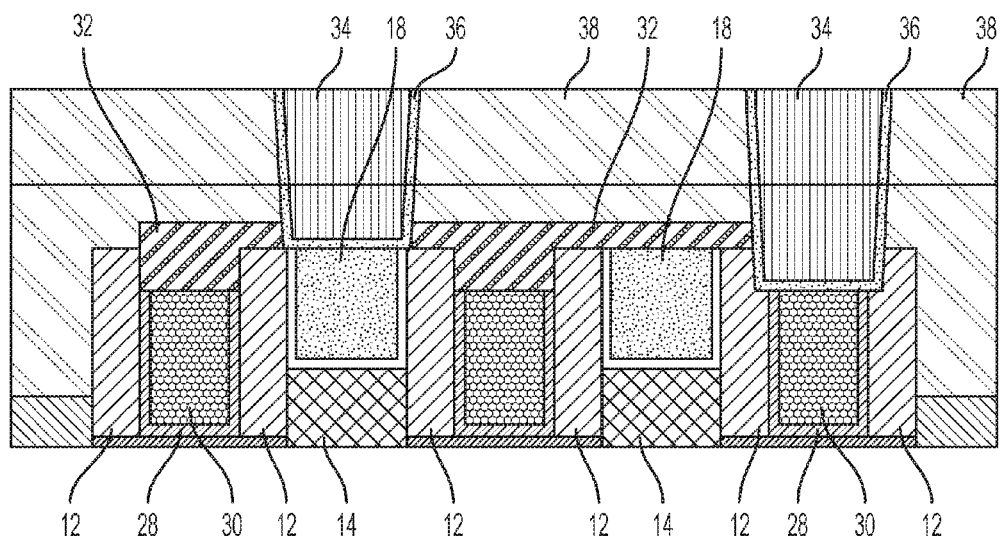

Then, as shown in FIG. 2I, some embodiments include forming contact gates 34 and liner 36 in the ILD to form physical connections with replacement metal gate material 30 or contact material 18.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor device, the method comprising:
   forming a plurality of sacrificial gates on a channel region of a substrate;
   growing epitaxial layers on one or more source-drain areas between the sacrificial gates by an epitaxial growth process;
   depositing a contact liner;
   depositing a contact material;
   partially removing the liner and the contact material, such that the liner and the contact material are removed from above the sacrificial gates;
   blocking one or more contact areas with one or more masking materials to create exposed contact material and blocked contact material;
   etching a portion of the exposed contact material;
   removing the masking material;
   partially recessing the contact material such that the contact areas have contact material that is at a height that is lower than a target metal gate height;
   depositing a nitride liner;
   depositing an oxide layer on the nitride liner;
   removing the sacrificial gate, thereby leaving an opening in area channel region;
   forming a metal gate and an insulator on the channel region;
   recessing the metal gate to a height that is above a height of the oxide layer in between the gates; and
   partially recessing the insulator material and the metal gate material to the target metal gate height and forming a cap over the metal gate.

2. The method of claim 1, wherein partially removing the liner and the contact material comprises polishing the transistor to the level of the top of the sacrificial gates with chemical mechanical planarization.

3. The method of claim 1, wherein partially removing the liner and the contact material comprises removing the liner and the contact material to the top of the sacrificial gates with gas cluster ion beams or reactive ion etching.

4. The method of claim 1, wherein the liner is a titanium-based liner.

5. The method of claim 1, wherein the contact material is tungsten.

6. The method of claim 1, wherein the contact material is cobalt or copper.

7. The method of claim 1, wherein planarizing to expose the sacrificial gate comprises using chemical mechanical planarization, gas cluster ion beams, or reactive ion etching.

8. The method of claim 1, wherein the insulator material is a high-k dielectric material.

9. The method of claim 1, wherein recessing to expose the contact material comprises chemical mechanical planarization or glass cluster ion beam reactive ion etching.

10. The method of claim 1, further comprising forming a silicide layer over the epitaxial layers before depositing the liner.

11. A method of forming a semiconductor device, the method comprising:
- forming a plurality of sacrificial gates on a channel region on a substrate with spacers on sides of the sacrificial gates;
- growing epitaxial layers on one or more source-drain areas between the sacrificial gates by an epitaxial growth process;
- depositing a liner;
- depositing a contact material;
- uniformly recessing the contact material to a target contact height;
- depositing a nitride liner;
- depositing an oxide layer on the nitride liner;
- planarizing to expose the sacrificial gate;
- removing the sacrificial gate, thereby leaving an opening exposing the channel region;
- lining the opening with an insulator material;
- filling the opening with a metal gate material;
- partially recessing the insulator material and the metal gate material to the target metal gate height and forming a cap over the metal gate material;
- blocking one or more contact areas with one or more masking materials to create exposed contact material and blocked contact material; and
- etching a portion of the exposed contact material.

12. The method according to claim 11, further comprising depositing an interlayer dielectric material.

13. The method according to claim 12, further comprising polishing the interlayer dielectric.

14. The method according to claim 13, further comprising patterning one or more contact gates in the interlayer dielectric.

15. The method of claim 11, wherein the blocked contact material is contact material in the source-drain areas and the exposed contact material is contact material outside of the source-drain areas.

16. The method of claim 11, wherein the liner is a titanium-based liner.

17. The method of claim 11, wherein the contact material is tungsten.

* * * * *